United States Patent
Yonemoto et al.

[11] Patent Number: 5,880,522
[45] Date of Patent: Mar. 9, 1999

[54] STAMPED LEAD FRAME WITH ADHESIVE LAYER FOR FIXING TO SEMICONDUCTOR DEVICE

[75] Inventors: Takaharu Yonemoto; Hiroshi Sugimoto; Shigeo Hagiya; Noriaki Taketani; Osamu Yoshioka, all of Ibaraki, Japan

[73] Assignee: Hitachi Cable, Ltd., Tokyo, Japan

[21] Appl. No.: 897,828

[22] Filed: Jul. 21, 1997

[30] Foreign Application Priority Data

Jul. 24, 1996 [JP] Japan .................................. 8-194522

[51] Int. Cl.⁶ .......................... H01L 23/50; H01L 23/495
[52] U.S. Cl. .......................... 257/666; 257/783; 257/676; 257/669; 257/672
[58] Field of Search ..................... 257/646, 676, 257/668, 787, 669, 672, 675, 783

[56] References Cited

U.S. PATENT DOCUMENTS

| | | | |
|---|---|---|---|
| 4,951,119 | 8/1990 | Yonemochi et al. | 257/666 |
| 5,091,251 | 2/1992 | Sakumoto et al. | 428/352 |
| 5,175,060 | 12/1992 | Enomoto et al. | 257/672 |
| 5,221,642 | 6/1993 | Burns | 438/118 |
| 5,358,906 | 10/1994 | Lee | 257/666 |
| 5,521,426 | 5/1996 | Russell | 257/666 |
| 5,559,366 | 9/1996 | Fogal et al. | 257/666 |
| 5,593,774 | 1/1997 | Hiroe et al. | 428/343 |
| 5,635,009 | 6/1997 | Kawamura et al. | 156/261 |

FOREIGN PATENT DOCUMENTS 4-75355  3/1992  Japan .

*Primary Examiner*—Alexander Oscar Williams
*Attorney, Agent, or Firm*—McDermott, Will & Emery

[57] ABSTRACT

A lead frame for LOC is provided which, even when an adhesive is applied to a lead prepared by stamping, can ensure insulation of a semiconductor element mounted from the lead. In applying an adhesive to a predetermined position of an inner lead 1 in a lead frame prepared by stamping to form an adhesive layer 4, the adhesive layer 4 is provided on the droop face of the inner lead 1. The droop face has no burr and a bulged center portion, permitting contact, derived from the burr, between a lead face and a semiconductor element, to be avoided, which ensures satisfactory insulation of the semiconductor element mounted from the lead.

5 Claims, 2 Drawing Sheets

STAMPED LEAD FRAME WITH ADHESIVE LAYER FOR FIXING TO SEMICONDUCTOR DEVICE

BACKGROUND OF THE INVENTION

1. Field of the Invention

The present invention relates to a lead frame and a semiconductor device using the same and in particular to a lead frame best suited for a semiconductor device having an LOC structure and a semiconductor device using the same.

2. Description of the Related Art

Lead frames for semiconductor devices having an LOC (lead on chip) structure or the like, which can realize high density assembly, are known in the art. One of them is a lead frame used in a system where a high heat-resistant insulating film (usually a polyimide film) coated with a thermoplastic or thermosetting adhesive layer is applied to one side or both sides of the lead frame and a semiconductor chip is mounted on the high heat-resistant insulating film under heating or under pressure.

Application of the high heat-resistant insulating film to the lead frame has hitherto been performed by die stamping application. In this method, a film in a reel form is stamped by means of a die into a desired shape and then applied to the lead frame under heating or under pressure.

The above method, however, poses problems, involved in the use of an adhesive double coated polyimide film, including that (1) the price of the tape is high, (2) the water absorption of the polyimide film is so high that the reliability of a package using such a film is unsatisfactory, and (3) the thickness of the tape is large making it difficult to reduce the thickness of the package.

In order to eliminate the above inconvenience, a method has been proposed which comprises: applying an adhesive alone onto a lead frame in its area where a semiconductor device is to be mounted; and mounting (bonding) the semiconductor device to the lead frame with the aid of this adhesive (for example, Japanese Patent Laid-Open No. 75355/1992).

For the application of the adhesive, a device comprising a combination of an X-Y robot with a dispenser is generally used to apply an adhesive in a varnish form (for example, a solution of an adhesive resin dissolved in a solvent) onto a lead frame in its area where a semiconductor device is to be mounted (for example, a front end of an inner lead). In particular, when an adhesive is applied to the front end of the lead, a spot coating method is used wherein the adhesive is pneumatically delivered through a needle (or nozzle) onto a lead frame in its predetermined area while moving the needle (or nozzle). In this method, what is required is only to coat a required amount of the adhesive onto the lead frame. Therefore, no waste material is produced, and no expensive die is required, advantageously resulting in reduced production cost.

The trend toward mass production of an adhesive coating type LOC lead frame has resulted in a shift of the lead frame from an etching lead frame to a stamping lead frame.

According to the conventional lead frame for LOC, in the case of the etching lead frame, there is no difference in results between coating of an adhesive on one surface and coating of the adhesive on the other surface. On the other hand, in the case of the stamping lead frame suitable for mass production of the lead frame, the face on the punch side and the face on the die side are different from each other in flatness and creation of burrs, leading to a remarkable difference in results of coating between both the faces. In particular, the difficulty, of ensuring insulation, due to a difference in thickness and evenness of adhesive coating and occurrence in burrs of the lead frame is a serious problem. The state of adhesive coating greatly influences the fixation of a semiconductor element to the lead frame. In the stamping lead frame, the face to be coated with an adhesive has not been specified in the art, rendering the provision of an adhesive layer 4 on the burred face unavoidable.

SUMMARY OF THE INVENTION

Accordingly, an object of the present invention is to provide a lead frame, for LOC, which, when an adhesive is coated on a lead prepared by pressing, does not influence the insulation of a semiconductor element mounted, and a semiconductor device using the same.

In order to attain the above object, according to one aspect of the invention, there is provided a lead frame for LOC comprises: an inner lead, prepared by stamping, having a droop face and a burred face; and an adhesive layer provided on the inner lead in its predetermined position, wherein the adhesive layer is provided on the droop face of the inner lead.

According to the above constitution, the provision of an adhesive layer on the droop face free from a burr and having a bulged center portion can avoid the contact of a lead face with a semiconductor element, satisfactorily ensuring insulation of the semiconductor element from the lead.

According to another aspect of the present invention, there is provided a semiconductor device comprising: an inner lead, prepared by pressing, having a droop face and a burred face; an adhesive layer provided on the inner lead in its predetermined position; and a semiconductor element fixed to the inner lead through the adhesive layer, wherein the adhesive layer fixing the semiconductor element to the inner lead is provided on the droop face of the inner lead.

BRIEF DESCRIPTION OF THE DRAWINGS

The present invention will be explained in more detail in conjunction with the appended drawings, wherein.

DESCRIPTION OF THE PREFERRED EMBODIMENTS

A preferred embodiment of the lead frame for LOC according to the present invention will be explained in conjunction with the accompanying drawings.

Figure 1:
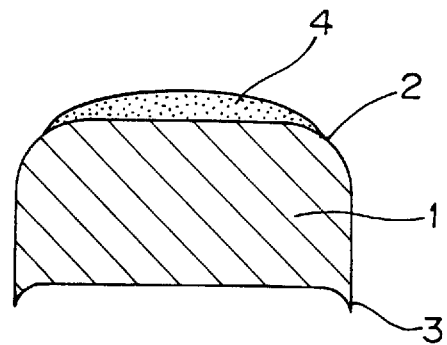
FIG. 1 is a cross-sectional view of one lead in a lead frame for LOC according to the present invention.

FIG. 1 is a cross-sectional view showing one lead in the lead frame for LOC according to the present invention.

Figure 2:
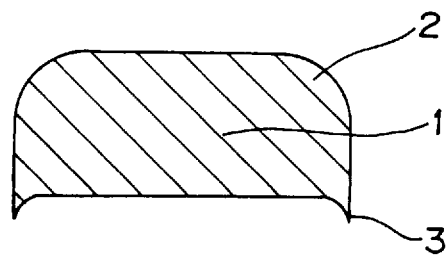
FIG. 2 is a cross-sectional view of an inner lead section in a stamping lead frame.

As shown in FIG. 2, an inner lead 1, in a stamping lead frame, prepared by stamping is in such a form that a droop portion 2 is created at edges of one side of the lead with a burr 3 created at edges of the other side of the lead. Stamping is performed using a punch and a die. In FIG. 2, the upper surface is a face on the punch side, and the lower surface is a face on the die side. In the face on the punch side, the material is drawn at the time of stamping, to create a droop, while in the face on the die side, when the material is finally broken, a part of the material is left to create a burr 3. The face on the die side is generally called "burred face." The size of the burr, in some cases, amounts to several tens of $\mu$m although it varies depending upon punching conditions.

In the adhesive coating type LOC lead frame, the thickness of the adhesive coating is about 20 $\mu$m, and the formation of an adhesive coating having a larger thickness requires increasing the viscosity of the adhesive or the number of times of coating. This is unfavorable from the practical viewpoint.

Figure 3:
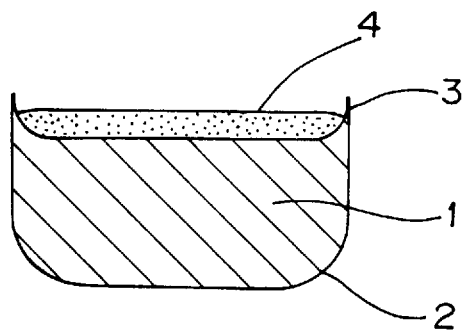
FIG. 3 is a cross-sectional view showing the formation of an adhesive layer by coating an adhesive on the burred face of a lead.
Figure 4:
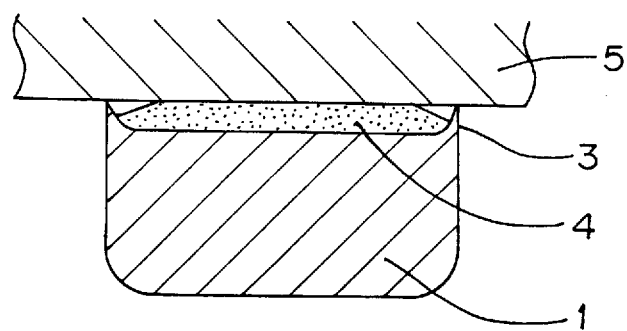
FIG. 4 is a cross-sectional view showing the occurrence of a contact to chip in the case where the height of a burr on the burred face of a lead is larger than the thickness of the adhesive layer.

FIG. 3 is a cross-sectional view showing the formation of an adhesive layer 4 by coating an adhesive onto the burred face of an inner lead 1. In this case, the height of a burr 3 is larger than the thickness of the adhesive layer 4. If the height of the burr 3 is smaller than the thickness of the adhesive layer 4, no problem is raised associated with the fixation of a semiconductor element 5 to the adhesive layer 4 provided on the face with the burr 3. On the other hand, if the height of the burr 3 is larger than the thickness of the adhesive layer 4, as shown in FIG. 4, the burr 3 comes into contact with the bottom of the semiconductor element 5, leading to a fear that insulation of the semiconductor element 5 from the lead frame cannot be ensured.

Figure 5:
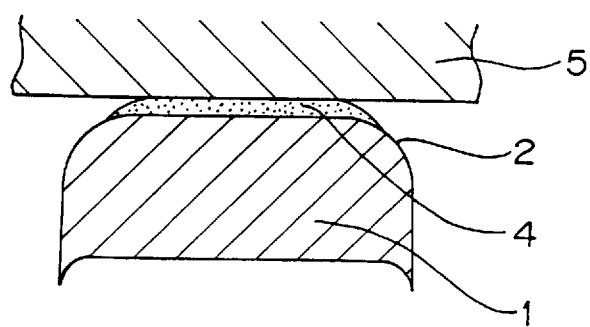
FIG. 5 is a cross-sectional view showing mounting of a semiconductor element on the lead frame for LOC according to the present invention.

For this reason, according to the present invention, as shown in FIG. 1, the adhesive layer 4 is coated on the droop face. In the droop face, the central portion is raised as compared with the edges. Therefore, as shown in FIG. 5, fixation of the semiconductor device 5 onto the adhesive layer 4 shown in FIG. 1 does not cause the lower surface of the semiconductor device 5 to come into contact with the surface of the lead frame, permitting the insulation to be surely ensured.

EXAMPLE

The present invention will be explained in more detail with reference to the following example.

A lead frame for LOC of a 42-pin TSOP (thin small outline package) was prepared by stamping and then plated with silver. At the time of the stamping, in the front end of an inner lead of this lead frame, burrs having a maximum height of 25 $\mu$m were created on the face on the die side (burred face). A thermoplastic adhesive varnish was coated with the aid of a dispenser on the front end of the lead frame for LOC to form a coating which was then dried to form an adhesive layer.

Two types of lead frames for LOC were prepared. One of them was such that the adhesive was coated on the droop face (example of the invention), while the other lead frame was such that the adhesive was coated on the burred face (comparative example). For both the lead frames for LOC, the coating thickness was 20 $\mu$m. For each lead frame for LOC, as shown in FIG. 5, a semiconductor element was fixed by bonding to construct a semiconductor device. This bonding was performed by placing a semiconductor device on a stage heated to 400° C., registering the lead frame with the adhesive layer coated thereon above the semiconductor device, and conducting pressing at 420° C. by means of a heating tool. The load applied to the heating tool was 4 kg.

After the bonding, the surface of the semiconductor element underlying the inner lead was observed. Further, electrical properties of the semiconductor device was investigated. The results were as summarized in Table 1.

TABLE 1

| Face coated with adhesive | Number of semiconductor elements with cracked surface | Number of semiconductor elements with abnormal electric characteristics |
| --- | --- | --- |
| Sagged face | 0/250 | 0/250 |
| droop face | 190/250 | 225/250 |

As is apparent from Table 1, when the lead frame with the adhesive coated on the droop face was used, no crack was created on the surface of the semiconductor element and the electrical properties are also good. On the other hand, in the case of the lead frame with the adhesive coated on the burred face, for some of the semiconductor elements, a crack was created in the surface thereof, and the electrical properties were abnormal.

Thus, it was confirmed that, in the case of an adhesive coating type LOC lead frame using a pressing lead frame, use of the droop face as the adhesive coating face enables a semiconductor element to be mounted on the lead frame without any damage to the semiconductor element.

As is apparent from the foregoing description, according to the present invention, since an adhesive layer to be located in a predetermined position of an inner lead prepared by pressing is provided on the droop face of the inner lead, the led face does not come into contact with the semiconductor element, ensuring the insulation of the semiconductor element from the lead face. This contribute to an increase in efficiency of mounting of a semiconductor element on a lead frame, improving the reliability of the package.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A lead frame for LOC, comprising: an inner lead, prepared by stamping, having, as an artifact of stamping, a droop face with corners slightly rounded and an opposite burred face having corners burred; and an adhesive layer provided on the droop face of the inner lead.

2. A lead frame for LOC, according to claim 1, wherein:
   the adhesive layer is a predetermined thickness controlled dependently on its viscosity.

3. A semiconductor device comprising: an inner lead, prepared by stamping, having, as an artifact of stamping, a droop face with corners slightly rounded and an opposite burred face having corners burred; an adhesive layer provided on the inner lead in its predetermined position; and a semiconductor element fixed to the inner lead through the adhesive layer,
   wherein the adhesive layer fixing the semiconductor element to the inner lead is provided on the droop face of the inner lead.

4. A lead frame for LOC, according to claim 1, wherein the adhesive layer is provided by an adhesive coating coated on, and conforming to, the droop face of the semiconductor lead.

5. A semiconductor device, according to claim 3, wherein the adhesive layer comprises an adhesive coating coated on, and conforming to, the droop face of the inner lead.

* * * * *